United States Patent
Williams

(10) Patent No.: US 7,137,057 B2
(45) Date of Patent: Nov. 14, 2006

(54) METHOD AND APPARATUS FOR PERFORMING ERROR CORRECTION CODE (ECC) CONVERSION

(75) Inventor: Emrys Williams, Milton Keynes (GB)

(73) Assignee: Sun Microsystems, Inc., Santa Clara, CA (US)

( * ) Notice: Subject to any disclaimer, the term of this patent is extended or adjusted under 35 U.S.C. 154(b) by 476 days.

(21) Appl. No.: 10/337,580

(22) Filed: Jan. 7, 2003

(65) Prior Publication Data

US 2004/0133836 A1    Jul. 8, 2004

(51) Int. Cl.
*H03M 13/00* (2006.01)

(52) U.S. Cl. ............................ 714/774; 714/757
(58) Field of Classification Search ............ 714/774, 714/757
See application file for complete search history.

(56) References Cited

U.S. PATENT DOCUMENTS

| | | | | |
|---|---|---|---|---|
| 5,392,299 | A | * | 2/1995 | Rhines et al. ............... 714/756 |
| 5,537,421 | A | * | 7/1996 | Dujari et al. ............... 714/785 |
| 5,583,786 | A | | 12/1996 | Needham |
| 5,949,796 | A | * | 9/1999 | Kumar ........................ 370/529 |
| 6,029,264 | A | * | 2/2000 | Kobayashi et al. ......... 714/755 |
| 6,263,466 | B1 | * | 7/2001 | Hinedi et al. ............... 714/755 |
| 6,320,852 | B1 | * | 11/2001 | Obuchi et al. .............. 370/328 |
| 6,745,359 | B1 | | 6/2004 | Nadeau-Dostie |
| 6,751,321 | B1 | | 6/2004 | Kato et al. |
| 6,886,121 | B1 | | 4/2005 | Dervisoglu et al. |
| 6,901,546 | B1 | | 5/2005 | Chu et al. |
| 2004/0133831 | A1 | | 7/2004 | Williams et al. |
| 2004/0133832 | A1 | | 7/2004 | Williams et al. |

FOREIGN PATENT DOCUMENTS

WO    01/25924 A1    4/2001

OTHER PUBLICATIONS

Stephen B. Wicker, Error Control Systems for Digital Communications, Prentice-Hall, 1996, pp. 116-121.*
Anshuman Chandra, "System-on-a-Chip Test-Data Compression and Decompression Architectures Based on Golomb Codes," IEEE, 2001, pp. 355-368.

* cited by examiner

*Primary Examiner*—Joseph Torres
(74) *Attorney, Agent, or Firm*—Lawrence J. Merkel; Meyertons, Hood, Kivlin, Kowert & Goetzel, P.C.

(57) ABSTRACT

An Error Correcting Code (ECC) conversion facility includes a first interface for receiving input data protected in accordance with a first ECC, and first and second processing paths, each connected to the first interface. First and second decoders are incorporated into respective first and second processing paths. Each of these decoders serves to extract clear data from input data protected in accordance with the first ECC. The first processing path also includes a decoder that can protect clear data in accordance with a second ECC. The output of the system is then connected to both the first and second processing paths, and produces output data protected in accordance with the second ECC. A first portion of this output data comprises data received from the first processing path, and a second portion of the output data comprises data received from the second processing path.

24 Claims, 6 Drawing Sheets

METHOD AND APPARATUS FOR PERFORMING ERROR CORRECTION CODE (ECC) CONVERSION

FIELD OF THE INVENTION

The present invention relates to performing a conversion between error correction codes (ECCs), such that the conversion does not compromise the protection provided by the ECCs.

BACKGROUND OF THE INVENTION

The pervasive use of computers in modern day society places stringent requirements on their reliability. One area where this is especially important is in the storage, manipulation and transmission of financial and other commercially significant information. For example, it is vital for the integrity of the banking system, which maintains most of its records on-line, that spurious errors do not creep into these records.

It is not realistic to build computing systems in which, prima facie, mistakes never occur. For example, memory devices and other components are normally exposed to random hits from cosmic rays, or natural background radioactivity. Such events can cause a physical change in the relevant device that will result in a change in its logical binary state, possibly leading to an erroneous data value being stored or otherwise processed. Another potential vulnerability is to lightning, which may cause a power surge, or some other form of electromagnetic interference. Likewise, data communications can be corrupted by extraneous noise.

In order to guard against such circumstances, it is routine for systems to incorporate error detection and/or correction schemes. The underlying concept here is to add redundancy to the data, in order to allow internal consistency to be verified. A break in this internal consistency will then reveal the presence of an error. In some schemes, the presence of an error can be detected, but not rectified, while other schemes allow for the automatic correction of certain errors. In accordance with standard terminology, we will refer to Error Correcting Codes (ECCs) to cover systems that perform error detection and/or error correction (i.e. an ECC may only detect errors, not necessarily correct them).

As a further point of terminology, the use of ECCs is particularly common in relation to the transmission and storage of data, but can also be utilised during other forms of data manipulation as well. We will use the term (data) processing herein to encompass all such forms of data manipulation, storage and transmission where ECCs may be employed.

A simple example of an ECC is the well-known parity bit. Thus if our data word (or block) has N bits, then the number of 1s in the word is counted, and the parity bit is set so that in total (i.e. including the parity bit) there is an odd number of 1s. This leads to an augmented data (code) word of N+1 bits, comprising the original N-bit data word, plus the additional parity bit. If a single bit of the augmented N+1 bits is then corrupted somehow, so as to have the opposite polarity, this error can be detected, since the parity bit will no longer be correct. This is true irrespective of whether it is the original data word or the parity bit itself that is corrupted. (It is also known to use a parity scheme with even parity; i.e. the parity bit is selected so that the number of 1s in the augmented data word is even).

If we define the distance between two code words as the number of bit positions in which they differ, then use of a parity bit ensures that there is a minimum distance of two, i.e. all code words differ by at least two bits. This is because if we start with two data words that are identical apart from a single bit position, then they must also differ in their parity bit as well, hence the minimum distance of two. A consequence of this is that the use of a solitary parity bit allows single bit errors to be detected, since the change of a single bit cannot lead to another valid code word, given that there is a minimum distance of two. On the other hand, if there is a double bit error (i.e. two bits change value), then this cannot normally be detected, since this will transform one valid code word into another potentially valid code word.

In addition, having a minimum distance of two implies that a single bit error, although detected, cannot be generally be rectified. This is because the corrupted code word is now exactly intermediate (at least) two valid code words; hence there is no unique correction value. Looking at this another way, the use of a single parity bit does not allow us to identify the location of a detected error. (It will be appreciated that with binary data, once the location of a single bit error has been determined, there is only one possibility for the correction—i.e. to flip the relevant bit).

It is known that in order to be able to correct single bit errors, the number of parity bits can be increased. One such scheme involves 3 parity bits for a 4-bit word ($b_3b_2b_1b_0$). If one parity bit corresponds to $b_3b_2b_1$, one parity bit to $b_3b_1b_0$, and one parity bit to $b_2b_1b_0$, a single bit failure anywhere in the augmented code word (of 7=4+3 bits) can be uniquely identified in terms of its location. This is feasible because there are 8 (=$2^3$) possible outcomes of the three parity tests, and only seven possible locations of the error. The bit value at the identified location can then be reversed in order to restore the original data value. Another way of looking at this code is that it can be shown that there is a minimum distance of 3 between valid code words in this scheme. Consequently, any single bit error can always be corrected back to the closest code word. Alternatively, the code can be used to ensure that any two-bit error is detected, since such a two-bit error cannot lead to a valid code word (however, with this approach, the ability to correct single bit errors is sacrificed).

Of course, the ability to detect an error, and especially to correct an error, comes at the cost of increased redundancy. Thus in the 3-bit parity scheme, only 4/7 of the code word is real data, with the rest of the code word being occupied by the parity protection. This then requires a corresponding increase in bandwidth to transmit the same amount of underlying data (or additional capacity for storage, and so on). It will be appreciated that in contrast, a single parity bit scheme has an efficiency of N/N+1, where N (the length of the original data word before parity) can nominally be selected to give an arbitrarily high efficiency. Note however, that if N is made too large, the risk of an undetectable two-bit error increases, thereby undermining the whole effectiveness of the parity scheme.

The use of one or more parity bits can be generalised into the set of linear block binary codes, where a data word having k bits is encoded or mapped into a code word having n bits (n>k). This is known as an (n, k) code. A range of useful mappings has been mathematically derived on the basis of vector algebra and group theory. These include cyclic redundancy codes (CRCs), which provide a set of cyclically related code words. For a given set of data, the CRC is determined using a generator polynomial having certain mathematical properties. The correctness of the processed data can subsequently be confirmed by dividing the processed data by the same generator polynomial to calculate the (so-called) syndromes. A zero value for a syndrome indicates no errors, while a non-zero value implies a particular error or errors, depending on the specific non-zero value obtained. One advantage of CRCs is that the encoding/decoding can be performed by relatively simple digital electronics, hence their attraction in computing. Further details about CRC codes are widely available in the literature, see for example "Data Communications, Computer Networks and Open Systems" by Fred Halsall, 1995, Addison Wesley (ISBN 0-201-42293-X) (see especially section 3.4).

One important known set of CRCs is the Bose-Chaudhuri-Hocquenghem (BCH) family of codes, which employs a particular type of generator polynomial. These codes are especially useful for correcting multiple errors. Related to the BCH codes are the Reed-Solomon (RS) codes, which can be used with non-binary data.

Note that a linear block code is regarded as systematic if the code word is formed by simply appending the ECC bits to the original data word (as with a parity bit). The advantage of this is clearly that the data can be quickly accessed, without having to perform any formal decoding; rather this would only be required to perform error correction/detection. In contrast, for a non-systematic scheme, no such simple decomposition of a code word into the data word and ECC bits is possible; rather the original data word can only be recovered by a full decoding operation. Note that many generator polynomials have both a systematic and non-systematic form.

In linear block codes, each code word is independent of all other code words, and so they can be individually decoded. (In fact, sometimes such codes are employed at a hierarchical level, such as one parity word per line of data, and then another parity word covering the whole page of data, including the per line parity words). However, in another important known form of coding, the value of a code word depends not only on the current input data word, but also on the previous data input(s). This type of coding, which maintains history or state information, is generally referred to as convolution coding, and can be implemented in a straightforward manner by the use of electronic feedback circuits. Convolutional coding systems, modelled for example as Markov processes, are particularly used in data transmissions, where the data to be encoded naturally forms a sequence. An advantage of convolutional systems is that they offer particularly good robustness against noise, although the decoding techniques, which are typically based on maximum likelihood, can be rather complex. Further details about convolutional coding (and also linear block coding) can be found in "Error Correcting Coding Theory" by Man Young Rhee, McGraw-Hill, 1989 (ISBN 0-07-052061-5).

It will be appreciated therefore that there is a very wide range of known ECCs, and that the choice of a particular ECC for any given set of circumstances will depend upon (and usually be a trade-off between) a number of factors. Thus relevant issues in selecting an ECC include the loss of capacity due to increased redundancy, the amount of computational complexity and time that is available for encoding/decoding, the susceptibility of the system to errors in the first place, the most likely type of errors (random bits, bursts of consecutive bits, etc.), the nature of the processing (clearly convolutional codes are only available for sequential data processing), and the relevant importance of error detection vis-à-vis error correction (for example, in a communications network, it is often possible to request a re-transmission of erroneous data, rather than having to try to correct it).

In addition, there may be additional influences on the choice of ECC, beyond pure error detection/correction. For example, it may be desirable for the output signal to have approximately equal numbers of zeros and ones in order to prevent a dc bias, or to avoid a long run of either zeroes or ones, in order to minimise the risk of losing synchronisation. Similarly, an ECC can be designed to ensure that each code word has a consistent number of runs of ones in order to provide a form of self-clocking (this is often true in particular of bar codes).

A complex computer system may in fact employ a number of different ECCs in various parts of the system. The advantage of this is that it allows the ECC used in each location to be optimised according to the particular circumstances, as discussed above. However, this then requires the system to perform the necessary conversions between the different ECCs. For example, data transmitted over a bus to a network interface card may utilise one form of ECC, while another form of ECC is then employed for transmissions out over the network itself. Indeed, the interface card manufacturer may have no option but to perform such an ECC conversion in these circumstances, in that the network and bus protocols may be defined by separate standards that each requires its own particular ECC.

FIG. 1 schematically illustrates a system for performing ECC conversion, in which incoming data encoded in accordance with a first ECC (ECC1) is received and decoded by unit 210. This unit then outputs the data to encode unit 230, which recodes the data for onward transmission as code words (i.e. data plus a second ECC, namely ECC2). Of course, decode unit 210 will also process the incoming data to retrieve the ECC portions, in order to verify that the incoming data has been correctly received. It then sends the result of this ECC decoding to a control unit 220. The result typically indicates whether: (a) there was no error in the received data; (b) an error was detected in the received data, but the ECC has allowed the error to be successfully corrected; or (c) an error was detected using the ECC, but this error cannot be corrected. One way of implementing this is to have two binary lines from the decode unit 210 to the control unit 220, a first indicating the presence/absence of a correctable error, a second indicating the presence/absence of an uncorrectable error.

Once the control unit has received the error signal from decode unit 210, it can then generate an appropriate signal to send to encode unit 230. For example, if there is no error in the received data, or if the error has been corrected, then an enable signal can be supplied to the encode unit. On the other hand, no such enable signal (or a disable signal) is supplied if the decode unit 210 detected an uncorrectable error.

The control unit 220 may be designed to report or further investigate the presence of the error in the received data, even if this has been corrected. In addition, control unit 220 may in some implementations be omitted altogether, with decode unit 210 outputting the results of its ECC check directly to encode unit 230, where this can be used as the basis for an enable or disable signal. It will be appreciated of course that the control signals, however achieved, must be maintained in synchronism with the transfer of the corresponding data between decode unit 210 and encode unit 230.

Given that ECC operations are involved in a very wide range of system activities, it is important that they do not become a bottleneck. Thus decode unit 210 and encode unit 230 are generally implemented in hardware in order to ensure a sufficiently high processing speed and throughput. This ties in with the fact that ECC activities are normally performed at a very low level, as defined for example in multi-layer network communications models.

Note also that decode unit 210 and encode unit 230 are nearly always provided as separate circuits that perform discrete decode and then encode operations. Thus it is not generally realistic to try to perform an overall conversion directly from one ECC into another. One reason for this is the wide range of possible ECCs, so that it would be very difficult to cater for every single potential conversion requirement. Perhaps more importantly, most ECCs have been especially selected and designed so that encoding and/or decoding are a highly efficient operations that can be easily implemented by digital electronics. In contrast, a direct conversion operation from one ECC into another ECC is likely to be far more complex and problematic. In other words, it is normally much faster and simpler to perform a decode followed by a separate encode, rather than to attempt a conversion from one ECC format directly into another ECC format.

Unfortunately however, there is a risk associated with the use of separate decode and encode facilities, in that it is possible for data to become corrupted in transit between the two. It will be appreciated that at this stage there is no ECC associated with the data, and so such corruption cannot be detected (and certainly not corrected). Consequently, the corrupted data will then be encoded by unit 230 as if it were the correct data, and subsequently passed onto other system components for further processing, thereby spreading the error.

In fact, this vulnerability extends generally to the output side of decode unit 210 (once ECC1 has been removed from the incoming data), as well as to the input side of encode unit 230 (prior to addition of ECC2 to the outgoing data). Thus any error introduced into the data between these two points, whether through device malfunction, some extraneous event, such as a cosmic ray, or any other source, may subsequently propagate throughout the system as apparently legitimate, but actually erroneous, data. It will be appreciated that this is a most undesirable possibility, and can potentially undermine all the care taken with ECCs in the remaining portion of the system.

SUMMARY OF THE INVENTION

In accordance with one embodiment of the invention there is provided apparatus for performing an error correcting code (ECC) conversion. The apparatus has a first interface for receiving input data protected in accordance with a first ECC, and first and second processing paths, each connected to the first interface. The first and second processing paths include respective first and second decoders, each of which is operable to extract clear data from the input data protected in accordance with the first ECC. The first and second processing paths also include respective first and second encoders, located after the corresponding decoders. Each of these encoders is operable to protect clear data in accordance with a second ECC. A second interface is connected to both of the first and second processing paths. The second interface is operable to communicate or transmit output data protected in accordance with the second ECC. A first portion of the output data is received from the first processing path, and a second portion of the output data is received from the second processing path. (Note that references to "first" and "second" portion do not necessarily imply any particular ordering within the output data; thus the first and second portions might be interleaved, or arranged in any other suitable order).

Because the apparatus has two independent processing paths, each of which contributes to the output data, any fault on one of the processing paths will lead to output data that is internally inconsistent (in other words, does not conform to the requirements of the second ECC). This can then be detected by the recipient of the output data, who is therefore alerted to the fact that an error has occurred within the apparatus. Accordingly, this approach provides protection during conversion from one ECC to another, unlike prior art approaches such as that shown in FIG. 1.

In most implementations the first ECC is different from the second ECC, even if this is just due to a difference in size of code word. However, the apparatus may still be employed even if the first ECC and the second ECC are the same. This latter approach can be used, for example, to split up one long link into multiple stages, each with a reconstituted ECC, thereby helping to reduce the risk of (undetectable) multiple errors accruing over the long link.

The apparatus can be utilised with any available form(s) of ECC, such as parity protection, linear block coding, convolutional coding, and so on. The selected ECC will in turn determine the appropriate size and structure of the input and output data (e.g. data words, data lines, data blocks, etc.).

In one particular embodiment, the second ECC is systematic, in other words, each code word comprises the clear data with an appended ECC portion. This then allows the second portion of the output data to be formed directly from the clear data output from the second decoder, while the first portion, corresponding to the ECC, is taken from the first encoder. Consequently, the second encoder can be a null encoder (in effect, it can be omitted).

Where the second encoder is present after the second decoder, this configuration can be used irrespective of whether or not the second ECC is systematic. One portion of the output data is selected from the first encoder, and another portion from the second encoder, with these portions being arranged in any appropriate order, and potentially interleaved, in order to maximise protection against errors. The two encoders may output only the relevant portion to be formed into the output data, or they may output the complete output data (i.e. corresponding to all of the original input data, as now protected by the second ECC). In this latter case, a mixer can then be inserted between the second interface and the first and second processing paths. The mixer is operable to extract and then combine the first and second portions from the first and second encoders respectively, in order to generate the output data.

In one embodiment, at least one comparator is used to confirm that the outputs of the first and second encoders properly match one another. Although this adds path length to the conversion process, it does provide a safeguard against any internal errors that might occur within the apparatus itself. Thus if any discrepancy is found between the two outputs, this reflects an error condition that can be signalled accordingly.

There are a variety of ways in which this may be achieved. One possibility is to provide an output error flag, while another is to incorporate an error indicator within the data to be protected by the second ECC. This latter approach has the advantage that the error indicator is then protected itself by the second ECC. In one embodiment, the output error flag or indicator is also set whenever the first or second decoder detects an uncorrectable error in the input data, since again in this case the apparatus is unable to provide reliable output data.

Note that in order to minimise the additional path length, it may be adequate to only compare a portion of the outputs from the two encoders. For example, in one embodiment (using a systematic code), only the ECC portions are compared. Such an approach exploits the fact that these ECC portions are sensitive to any slight change in the data prior to reaching the encoders, and therefore particularly good for discriminating errors (for their size).

In accordance with another embodiment of the invention there is provided an error correcting code (ECC) conversion facility comprising an input that divides into parallel processing paths. Each path includes an ECC decoder, and at least one of the paths also includes an ECC encoder. The output of the facility is connected to each of the parallel processing paths. More particularly, this output is taken partly from each of the parallel processing paths, so that any error within one of the paths should break the internal consistency imposed by the ECC on the output.

In accordance with another embodiment of the invention, there is provided a method for performing an error correcting code (ECC) conversion. The method begins by receiving input data protected in accordance with a first ECC, and directing the received input data along each of first and second processing paths. Clear data is then extracted from the input data at each of first and second decoders incorporated into the first and second processing paths respectively. A first encoder is incorporated into said the processing path and determines at least an ECC portion for protecting the clear data with a second ECC. Next, output data is generated, representing the input data now protected in accordance with the second ECC. A first portion of this output data is received from the first processing path, while a second portion of the output data is received from the second processing path.

In one embodiment, the second ECC is systematic, so that the first encoder only needs to determine an ECC portion. This can then be simply combined at the output with clear data direct from the second decoder. In a slightly different configuration, a second encoder is incorporated into the second processing path. Each of the first and second encoders then generates a partial or full copy of the clear data protected in accordance with the second ECC, and these copies can be combined in order to generate the output data segment.

It will be appreciated that such a method can generally benefit from the same particular features as described above in relation to the apparatus embodiments.

BRIEF DESCRIPTION OF THE DRAWINGS

Various embodiments of the invention will now be described in detail by way of example only with reference to the following drawings in which like reference numerals pertain to like elements and in which.

DETAILED DESCRIPTION

Figure 2:
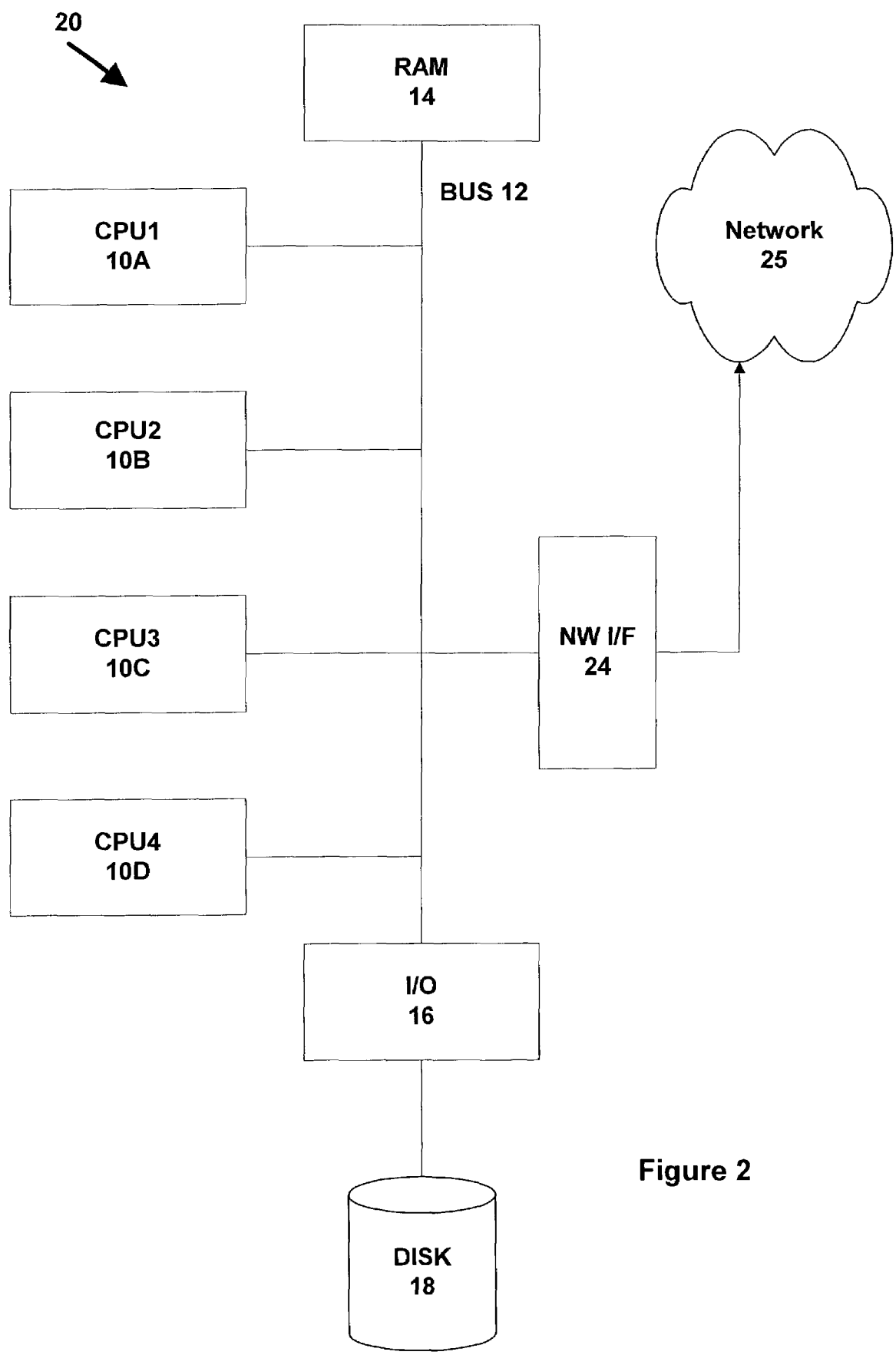
FIG. 2 is a high-level diagram of a typical (known) computing system.

FIG. 2 is a simplified schematic diagram of a typical (known) multi-processor system 20. System 20 includes four CPUs 10A, B, C and D (although of course more or fewer CPUs may be included in other embodiments). Each of these includes a processor (such as a SPARC processor from Sun Microsystems Inc), with associated registers, cache memory, and other components. The CPUs 10 are interconnected by bus 12, which also links them to shared physical memory, RAM 14. The CPUs 10 are further attached via an interface controller 16 to external disk storage 18. This may typically be provided by multiple disk drives, for example as arranged into a redundant array of inexpensive drives (RAID) architecture. Bus 12 is also connected to network interface 24 in order to allow system 20 to communicate via network 25. It will be appreciated that the computer system shown in FIG. 2 is purely illustrative, and a very wide variety of other possible configurations and sets of components are well-known in the art.

Figure 3:
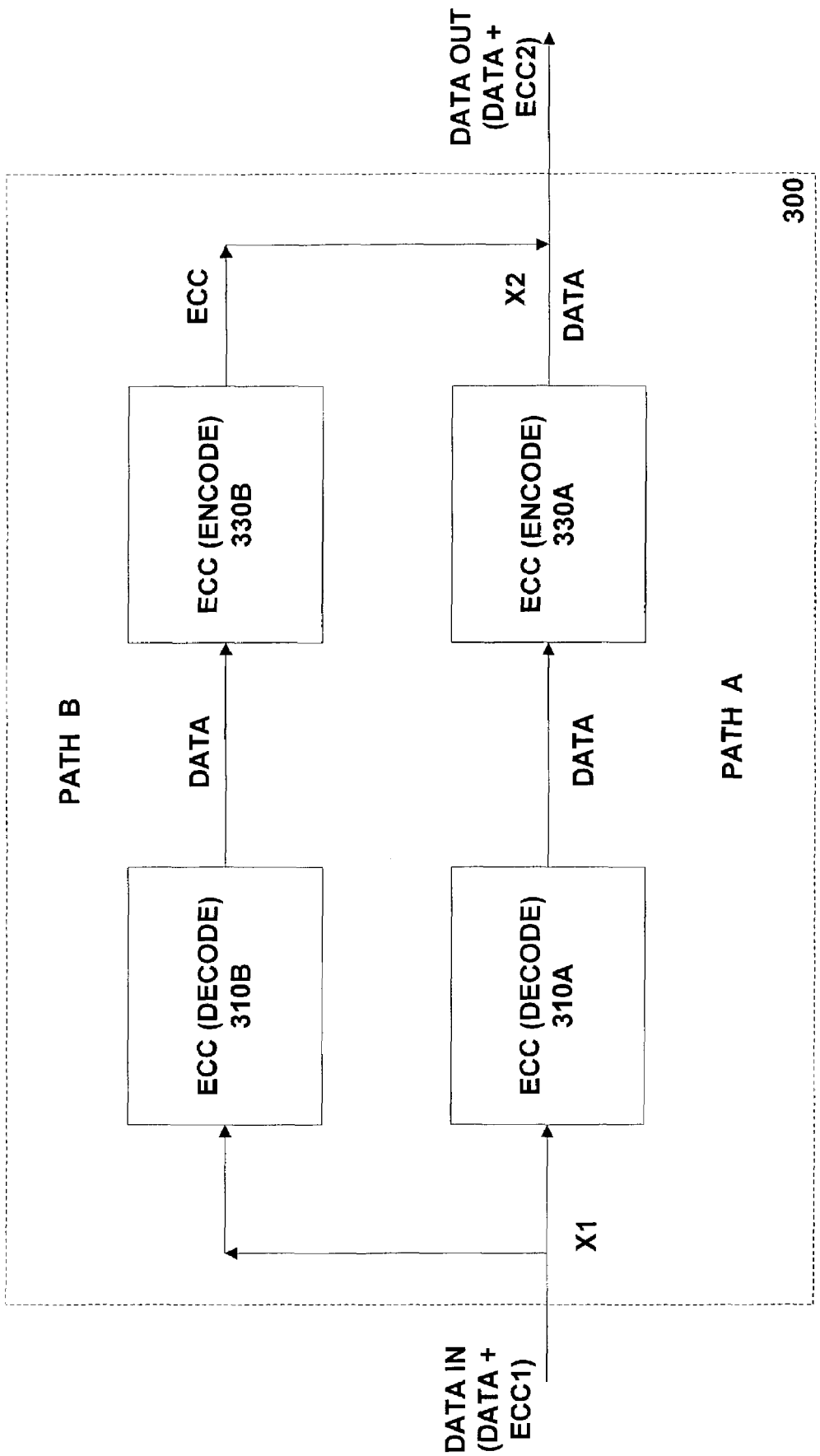
FIG. 3 is a simplified schematic block diagram of an ECC conversion facility in accordance with one embodiment of the invention.

FIG. 3 is a schematic block diagram of an ECC conversion facility 300 in accordance with one embodiment of the invention. This facility may be used, for example, in the computer system of FIG. 2, such as located within network interface unit 24 to convert the ECC from that used on bus 12 into that used on network 25 (and vice versa). Similarly the facility 300 may be located in storage input/output controller 16 to convert the ECC between that used on bus 12 and that used for storage on disk 18. A further possibility is that the facility 300 is located within a CPU 10, to convert the ECC between the format on bus 12, and an internal format used within the CPU 10 itself. Of course, the system of FIG. 2 may incorporate as many ECC conversion facilities as are required by the different forms of ECC utilised within the system.

As shown in FIG. 3, the ECC conversion facility 300 includes a pair of ECC decode units 310A, B, and a pair of ECC encode units 330A, 330B. Each of the decode units 310A, B, receives the incoming data, encoded using ECC1, and processes this to retrieve the unencoded (clear) data, which is then forwarded to a corresponding encode unit (330A, 330B respectively). The two encode units 330A and 330B utilise the same ECC algorithm as each other (i.e. ECC2), but one (330A) produces the data component only, while the other (330B) produces the ECC check bits only. The outputs from the two encode units are then combined, to produce the complete, protected code word for output from the facility 300.

In effect therefore, the ECC conversion facility 300 provides two independent paths for the error conversion. These are indicated as Path A and Path B in FIG. 3. It will be appreciated that if an error occurs in Path A, then the data output portion from the facility 300 will be incorrect, while if an error occurs in Path B, then the ECC output portion will be incorrect. Either of these outcomes can be detected (and possibly corrected) by decoding ECC2 when the output from the facility 300 is received at its destination, since this will reveal that the data component and the ECC component do not properly match one another.

Consequently, protection is achieved against any error that may occur between the two locations shown in FIG. 3 by X1 and X2. Moreover, since X1 lies on the incoming data link for facility 300, as protected by ECC1, while X2 lies on the outgoing data link, as protected by ECC2, this ensures that the ECC conversion facility 300 does not cause any break in overall ECC protection.

Note that although this increased protection is achieved at the expense of a more complex system in terms of numbers of components (compared to the conversion facility of FIG. 1), the parallel operation of the paths A and B means that the overall throughput of the conversion facility has not been reduced. As previously indicated, this is a very significant performance consideration, given the prevalence of ECCs at a low level within systems such as that shown in FIG. 2.

Of course, if both paths A and B in the facility 300 experience an error at the same time (in relation to the same data block), then this error may not be subsequently detectable. However, the use of independent paths for A and B in ECC conversion facility 300 should ensure that the chances of any such concurrent error are extremely small. It will be appreciated that this is in line with the general philosophy of ECCs as described above, in that they have a limited error detection/correction capability (this is mathematically unavoidable). In other words, one can always conceive of a pathological case that the overall ECC system cannot properly handle. Consequently, the general objective for ECC conversion facility 300 is that it is (at worst) no more susceptible to an undetectable error than the other components of the system.

In some embodiments, encode unit 330A may be omitted from the ECC conversion facility 300 illustrated in FIG. 3, in that it is simply passing through the raw data, rather than performing any coding per se. This possibility occurs whenever ECC2 is a systematic code, since in this case it is possible to assign one path to producing the output data component (path A in FIG. 3), and the other path to producing the output ECC component (path B in FIG. 3). It will be appreciated that the former path does not need an encode unit, given that its output is simply the clear data.

Although the embodiment of FIG. 3 illustrates the situation where ECC2 is indeed a systematic code, the ECC facility 300 can readily accommodate a non-systematic output code. For example, if the overall output from the ECC conversion facility is 16-bits, then this can be formed by taking a first byte from encode unit 330A, and a second byte from encode unit 330B. The effect of this is analogous to the situation just described for systematic codes, in that any error in one of the two paths will break the internal consistency of the ECC2 output data. Accordingly, such an error will be detectable by the recipient of data from ECC conversion facility 300. Of course, other patterns for combining the results from path A and path B could also be used rather than just appending one byte to another, such as interleaving individual bits, and so on. The optimum pattern for combining the bits from the two data paths (in terms of the sensitivity for error detection) may depend on the particular mathematical properties of the algorithm being used for ECC2.

Note that bit interleaving and such-like is in theory possible even if ECC2 has a systematic form. Thus rather than allocating one encode unit to purely the data component, and the other encode unit to purely the ECC component, the responsibility for these could be mixed across the two encode units. Alternate bits of the data and ECC portions could then be taken from each of the two encode units. (It will be appreciated that in this case, it is no longer possible to omit one of the encode units from ECC conversion facility 300).

In some embodiments the encode units 330A and 330B may be configured to only generate those bits that will be incorporated into the output from the facility 300. However, given the normal design of ECC circuitry as discussed above, it will usually be most convenient to first generate the full ECC and/or data portions as appropriate within units 330A/B. In this case, one possibility is to only output those particular bits that will be incorporated into the eventual output. Alternatively, some form of mixing device (not shown in FIG. 3) may be located at point X2. The mixer would then receive one (complete) input from encoder 330A, and another (complete) input from encoder 330B, and produce a single output by selecting particular bits from each input. For example, the mixer could select odd output bits from encoder 330A, and even output bits from encoder 330B.

In a typical embodiment of EEC conversion facility 300, ECC1 and ECC2 represent different ECC algorithms, although in some cases the distinction may simply be one of data word size rather than any change in the underlying ECC algorithm. For example, if the incoming link in FIG. 3 is an 8-bit bus, plus one parity bit, and the output link is a 16-bit bus, plus one parity bit, then ECC conversion is still required. A similar situation may occur if the packet size is different for the incoming and outgoing links (where the ECC is calculated on a per packet basis).

Nevertheless, there may be situations where ECC1 and ECC2 are identical, but decoding followed by encoding is still desirable (rather than simply having a continuous communications link). One reason for doing this is to be able to locate errors. Thus if there is a chain of communication all using the ECC1 algorithm, then inserting one or more ECC conversion facilities into this chain allows the location of any possible error to be ascertained more precisely; in other words, it can now be determined whether the error occurred before or after a given ECC conversion facility. This in turn can be useful for overall system design and management.

In addition, having a long unbroken chain of communication all using the same ECC algorithm may increase the risk of multiple errors occurring. For example, if we are using simple parity protection, then on a long stretch protected by a single ECC bit, the risk of an undetectable double-bit error may become unacceptably high. In contrast, if this long stretch is split into multiple stages, each separated by an ECC conversion facility, then the parity protection will work providing there is no more than a single error in any given stage.

Another reason why the ECC conversion facility 300 may be employed even where ECC1 and ECC2 are the same is if the incoming encoded data incorporates information that is needed for the ongoing transmission of the data. An example of this would be if the facility 300 were part of a network switching system, and the system needed to read a target address from an incoming data packet in order to be able to route it on properly. Of course, if ECC1 were a systematic code, then the address could be read without decoding, but it still may be desirable to perform error detection and/or correction at this stage.

(The skilled person will appreciate that if the input and output ECCs are identical, there may be some alternative approaches to achieving the above aims. For example, the main data flow may be tapped to provide an ECC decoder input, without having to decode/encode the main data flow itself. Nevertheless, a conversion facility such as shown in FIG. 3 does provide one option for implementation in these circumstances).

In most embodiments it is expected that corresponding units from FIG. 3 will be identical, i.e. decoders 310A and 310B will be the same, and encoders 330A and 330B will be the same. However, it will be appreciated of course, that this is not necessary, providing that their overall functionality is properly matched. For example, if ECC1 comprises a CRC, then decoders 310A and 310B can be any suitable (known) decoder for a CRC (not necessarily the same). Indeed, it is possible that having dissimilar decoder structures may slightly reduce the likelihood of a simultaneous error on both paths (which, as previously explained, can potentially defeat the ECC).

Another consideration is that although decoders 310A and 310B are shown in FIG. 3 as physically separate units, the actual components therein (i.e. XOR gates, etc) may be somewhat intermingled, in terms of being fabricated in neighbouring regions on the chip (rather than all the components of one decoder being clearly distanced from all the components of the other decoder). In such an arrangement, the two decoders still function independently, but their close physical proximity helps to reduce signal path length, given that they share a common input. This in turn may permit a higher processing speed. (Similar layout concerns also apply to the two encoders).

Figure 1:
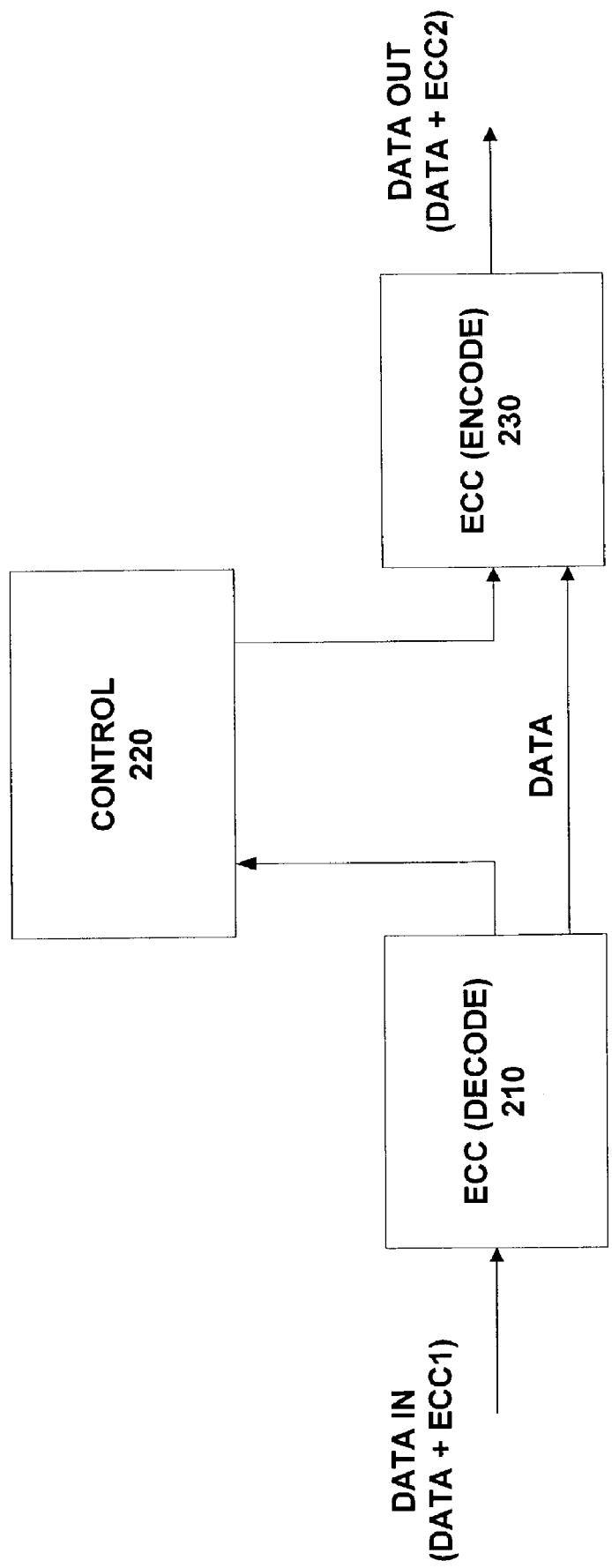
FIG. 1 is a schematic diagram of a known ECC decode unit and separate ECC encode unit that allow a data flow to be converted from one ECC format to another.

Note that for simplicity, FIG. 3 has omitted the control lines used for the signalling and subsequent handling of errors within conversion facility 300 (such as shown in FIG. 1). Nevertheless, it will be appreciated that they will be present in most practical implementations. (They are also discussed further in relation to the embodiments of FIGS. 4 and 5, below).

One complication that does arise with the conversion facility 300 is due to the fact that the response to errors is nonlinear. In particular, a single bit error in the data on Path B between the decoder 310B and the encoder 330B can affect multiple bits of the ECC generated by encoder 330B.

As an example of this, consider the (7, 4) scheme described earlier, where the three parity bits are determined by $b_3b_2b_1$, $b_3b_1b_0$, and $b_2b_1b_0$. Assuming that path B is used only the ECC bits, it can be seen that an error in one of data bits $b_3$, $b_2$, or $b_0$ will lead to two bits of the ECC being calculated incorrectly. Of course, given that the minimum distance of this code is 3, such an error is still detectable. In addition, although an error in data bit $b_1$ will actually lead to all three ECC bits being incorrect, this will also be detectable, for the simple reason that these ECC bits will not match the corresponding (correct) data from path A.

As on particular illustration of this, let as assume an input data word of 0001, which gets corrupted to 0011 in path B. With the above parity scheme, the correct code word should be 0001011, but due to the error the ECC portion is corrupted, resulting in the output 0001100 (the data component from path A is not corrupted). The presence of an error can then be detected by a recipient, since the output is not a valid code word. However, the "natural" action might then be to assume that only a single bit error has occurred, and "correct" the data word back to 0011.

It can be seen therefore that the nonlinearity of the ECC facility 300 causes a problem, in that a single bit error in certain places internal to the system can result in multiple bits being incorrect in the output. This can then mislead any subsequent error correction circuitry (based on ECC2), which will normally try to make a correction based on the smallest number of bits changes to the received (corrupted) code word.

There are three main strategies that can be adopted in relation to this problem. The first is simply to ignore it, or rather to accept it as a known deficiency. In general this would not be regarded as satisfactory, although it will be appreciated that prior art systems, such as shown in FIG. 1, are similarly exposed. Accordingly, the ability of facility 300 to properly correct some internal errors (such as a single bit error on path A) still represents an enhancement over these existing systems.

The second approach is to note that the problem only arises when the recipient downstream of facility 300 is performing error correction (rather than simple error detection). In other words, the nonlinearity described above does not prevent errors in facility 300 from being detected, but it does make them harder to correct reliably. Accordingly, systems can be designed so that, downstream of facility 300, errors in the ECC2 output are detected, but no attempt is made to try to correct them. This will prevent the use (unknowingly) of incorrect data, which in many circumstances is the main concern. Typically the correct data can then be obtained by re-accessing the original source.

Figure 4:
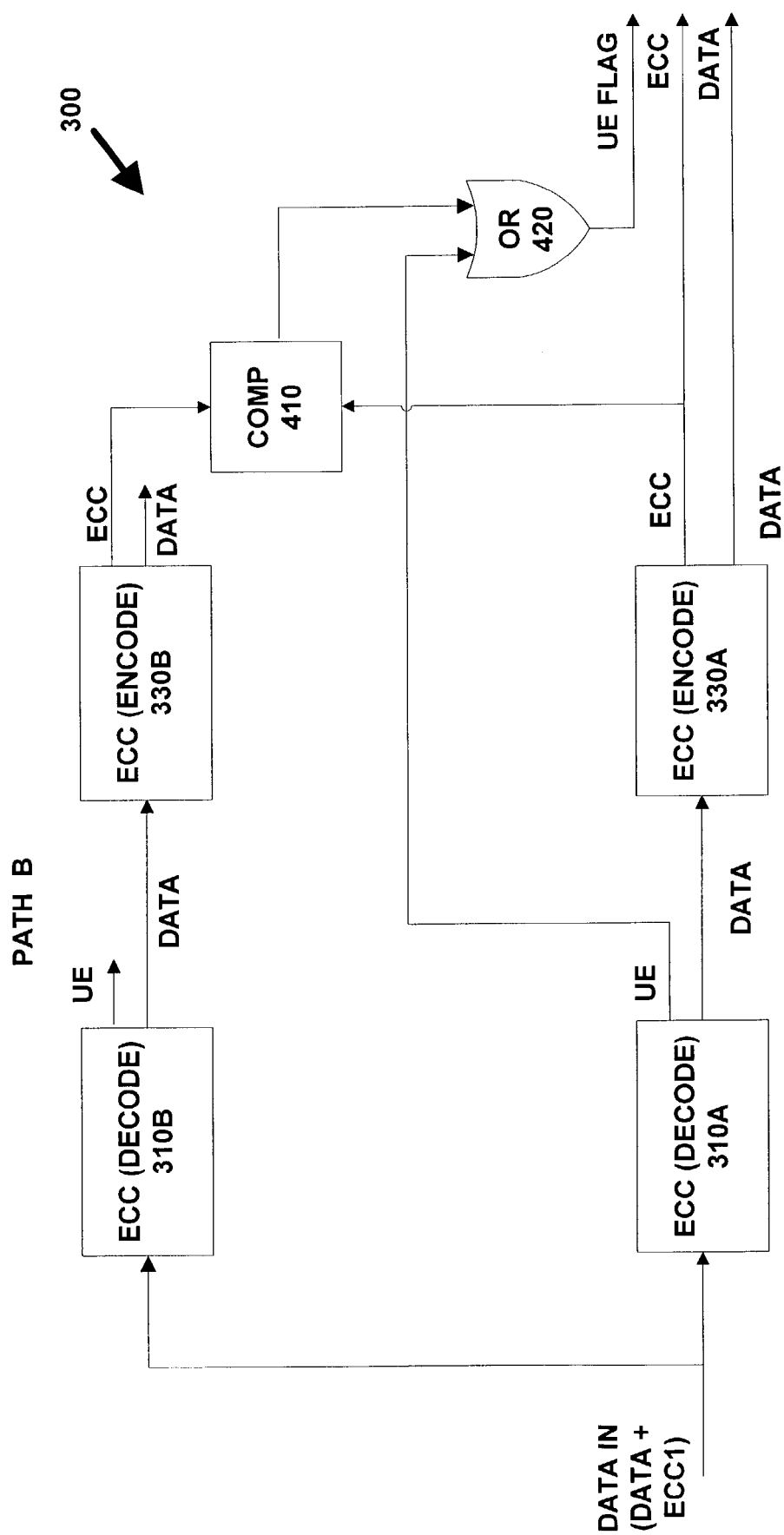
FIG. 4 is a simplified schematic block diagram of an ECC conversion facility in accordance with another embodiment of the invention.

The third approach, which is illustrated in FIG. 4, involves performing a check on the output of the two different encoders 330A and 330B. Thus the ECC conversion facility 300 of FIG. 4 has the same underlying operation and structure, involving paired ECC decoders 310A and 310B, and paired ECC encoders 330A and 330B, as the embodiment shown in FIG. 3. Accordingly, the present description will focus only on the differences between FIG. 4 and FIG. 3, rather than repeating material that is common to both.

In the ECC conversion facility 300 of FIG. 4, encoder 330A and encoder 330B both produce an output data signal and an output ECC signal, although the data output from encoder 330B is not actually used, and can be suppressed if desired. (In practice, it is usually easier to construct an encoder to a standard format that automatically generates both data and the corresponding ECC).

The ECC outputs from encoder 330A and from encoder 330B are both directed to comparator 410. The output of comparator 410 is in turn directed to OR-gate 420. If the ECC outputs from the two encoders match, then comparator 410 outputs a zero; alternatively, if the two inputs to comparator 410 do not match, then it outputs a one.

Comparator 410 therefore detects any discrepancy between the ECC signals calculated by the two encoders, and its output serves as a form of error signal. Thus if the outputs from the two encoders do not match, the signal from the comparator 410 is propagated through the OR-gate 420 to accompany the output from ECC conversion facility 300 as an error flag. In this manner, downstream recipients of this output are alerted by the flag to the fact that there is a potential error in the ECC portion of the output, and accordingly it should not be relied upon. In particular, such recipients will know not to try to apply any error correction, which may result in an inadvertent corruption of the data, as previously described.

The presence of comparator 410 does add path length to the conversion facility 300, thereby reducing the overall speed with which the ECC conversion can be performed. In order to try to minimise this impact, the comparator of FIG. 4 only looks at the ECC outputs of the two encoders, rather than the ECC plus data, or the data by itself. It will be appreciated that the ECC portion is generally more compact than the data portion, thereby minimising the processing task of comparator 410. In addition, the ECC portion represents a form of hash over the data portion, in that it is sensitive to slight changes in the data portion. In other words, any modification of the data portion is reflected in a corresponding change or changes in the (much shorter) ECC portion. (Of course, this factor underlies the whole operation of ECCs).

Furthermore, the non-linearity problem described above is inherent to the ECC portion of the encoder output, but not to the data portion (for a systematic code, such as shown in FIGS. 3 and 4). Thus a single bit error in the data on path A (but not on path B) will only lead to a single bit error in the data portion of the output from conversion facility 300. The situation then becomes analogous to where a data bit is corrupted after output from the ECC conversion facility, and this may subsequently be correctable (dependent on the particular properties of the ECC used by encoders 330A and 330B).

Nevertheless, it is possible to extend the operation of comparator 410 to check the data portions from encoders 330A and 330B as well. This will provide extra protection against any errors introduced within ECC conversion facility 300, albeit at the cost of increased path length. It will be appreciated therefore that for any given system, an appropriate balance for this trade-off can be made, dependent upon the perceived likelihood of one or more errors, the desired robustness against errors, and the desired overall processing speed (delay).

Note that although FIG. 4 illustrates the use of a systematic code, a similar scheme involving comparator 410 can also be adopted with a non-systematic code. In this case comparator 410 simply matches the whole code words from the two encoders in order to check for any discrepancy. Alternatively, in order to reduce path length, only a reduced number of bits may be compared. These bits are selected to still give good coverage for any errors in the incoming data word (the extent to which this is possible will depend upon the mathematical properties of the particular ECC).

Thus again in this situation there is a trade-off between processing speed (via path length) and robustness against errors. As before, the general approach is to estimate the likelihood of various errors, either alone or in combination, and then to provide sufficient error detection/correction capability that the probability of an undetected error is negligibly low (i.e. below a certain threshold).

FIG. 4 also illustrates a flag output (UE) from decoder 310A that is connected to OR gate 420. This flag is set to indicate that the decoder 310A has detected an uncorrectable error (typically because the data arriving at ECC conversion facility 300 has been severely corrupted). If the UE flag is set, then this is in effect propagated through the OR gate 420 (irrespective of the output from comparator 410), again alerting downstream recipients of the output from ECC conversion facility 300 that this cannot be relied upon.

It will be appreciated that a UE flag from decoder 310B may also be fed to OR gate 420, instead of or as well as the UE flag from decoder 310A. However, such a link is not implemented in the embodiment of FIG. 4, since any discrepancy between these two signals should manifest itself later as a mismatch at comparator 410 (and hence still result in an error signal through OR gate 420). Of course, the UE flag(s) may also be passed to a control unit (not shown in FIG. 4, but analogous to control unit 220 of FIG. 1)) for logging and/or diagnosis, etc. In addition, the presence (and rectification of) any correctable errors by decoders 310A and 310B may likewise be signalled to such a control unit, if so desired.

The use of the UE flag from FIG. 4 provides a straightforward way of signalling the presence of an error to a downstream recipient of output from error conversion facility 300. One limitation however with this technique is that the flag may itself be subject to an error in transmission. This can be addressed by the use of a "notdata" signal, such as described in Patent Application WO 01/25924, and as implemented in the embodiment of FIG. 5.

Figure 5:
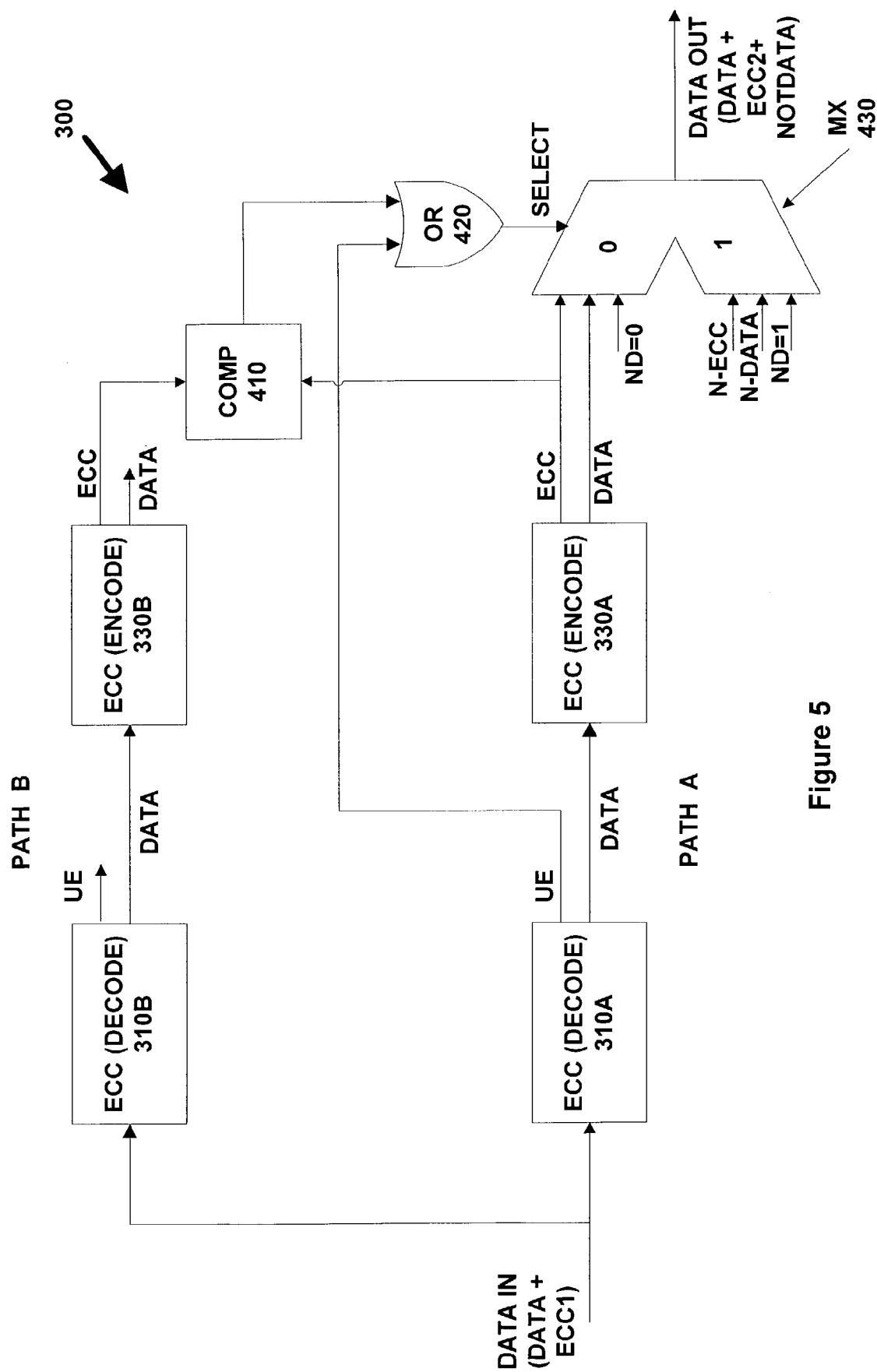
FIG. 5 is a simplified schematic block diagram of an ECC conversion facility in accordance with yet another embodiment of the invention.

The ECC conversion facility 300 of FIG. 5 has the same underlying operation and structure, involving paired ECC decoders 310A and 310B, and paired ECC encoders 330A and 330B, as the embodiments shown in FIGS. 3 and 4. (Accordingly, the present description will again focus only on the differences between FIG. 5 and FIG. 4, rather than repeating material which is common to a previously described embodiment).

The embodiment of FIG. 5 includes a multiplexer 430. This has two inputs:

(a) a first input comprising the data and ECC portions from encoder 330A, plus a notdata flag which is set to zero;

(b) a second input, in which the data and ECC portions are set to predefined values corresponding to notdata, while the notdata flag is set to 1.

The output of OR gate 420 is connected to the Select input of multiplexer 430, in order to control which of these two inputs is utilised for the output of multiplexer 430. Thus if the OR gate outputs a zero (indicating the absence of any error), then the output from the multiplexer 430 corresponds to the first input, namely the ECC and data from encoder 330A. This therefore represents the normal or expected output of the ECC conversion facility 300, and hence the notdata signal is set to 0.

However, if the output of the OR gate is one, indicating either a mismatch at comparator 410, or an uncorrectable error from decoder 310A (as described in relation to FIG. 4), then the second input to the multiplexer is selected as its output. In this second input, the notdata signal set to 1, alerting downstream recipients of the output from ECC conversion facility 300 that an error is present in its output, and so it cannot be relied upon.

An important aspect of the notdata flag is that it is covered by the ECC. Thus the ECCs generated by encoders 330A and 330B assume in effect that there is a zero (corresponding to the notdata signal) appended to the input data, and calculate the ECC accordingly. This can be implemented either by actually inputting a zero notdata indicator into the two encoders in association with the relevant data input, or it can be done implicitly through the internal design of the encoders.

Similarly, the predefined notdata ECC portion for the second input to multiplexer 430 represents the correct ECC for the predefined notdata data portion with a one appended (representing the positive notdata indicator). In other words, given the predefined notdata data portion plus the one as input, encoder 330A or 330B would output the predefined notdata ECC portion.

There are various possibilities for the contents of the notdata data portion itself. It may be set to some arbitrary fixed value, such as zero, or some meaningful fixed value, such as an identifier of the particular conversion facility 300 where the error has arisen. It may also be specifically determined in response to the detection of the error, for example to provide some form of diagnostic message.

The use of the notdata signal in the embodiment of FIG. 5 has the benefit of providing a robust indication of the presence or absence of an error to recipients of output from the error conversion facility 300. This is because the notdata flag itself is protected by the ECC coding. Thus even if the notdata signal were corrupted during subsequent data transmission, the resulting discrepancy with the ECC portion would still prevent the received data from being regarded as correct. In addition, it may also be possible to correct the notdata signal (depending on the particular ECC involved).

In addition, the notdata signal helps to distinguish between the detection of a new error, and the mere receipt of an error that has already been detected. Thus recipients of output from the error conversion facility 300 of FIG. 5 know that if the received ECC and data portions match, then there are no newly introduced errors. They can then go on to examine the notdata signal in order to determine whether or not the properly received data is in fact correct, or whether it was subject to an error at some earlier stage (which will be indicated by the notdata flag being set).

Of course, while the embodiment of FIG. 5 only utilises a notdata on the output side, there may also be a notdata signal on the input side. This can then be processed in the manner just described (typically after decoding of the input data has been performed), in order to confirm the correctness of the received data. Further details about the use of the notdata signal can be found in the above-referenced patent application.

As previously indicated, an ECC conversion facility 300 can be used in the context of routing serial packets. Thus an incoming packet arrives at the ECC conversion facility protected by a first ECC, and is then converted into an outgoing packet protected by a second ECC, for forwarding to an appropriate target (typically as determined by header information in the incoming packet).

One complication here is that for performance reasons, it is often desirable to start transmitting the outgoing packet before the incoming packet has completely arrived (this is known as cut-through routing). This implies that a systematic code is used on the incoming side in order to ensure that the address information for onward routing can be read directly from the header of the incoming packet, rather than first having to decode the whole packet to obtain the address. Similarly, a systematic code is used on the outgoing side, so that transmission of the data portion of the packet can begin before all of the incoming packet is available for processing.

Figure 6:
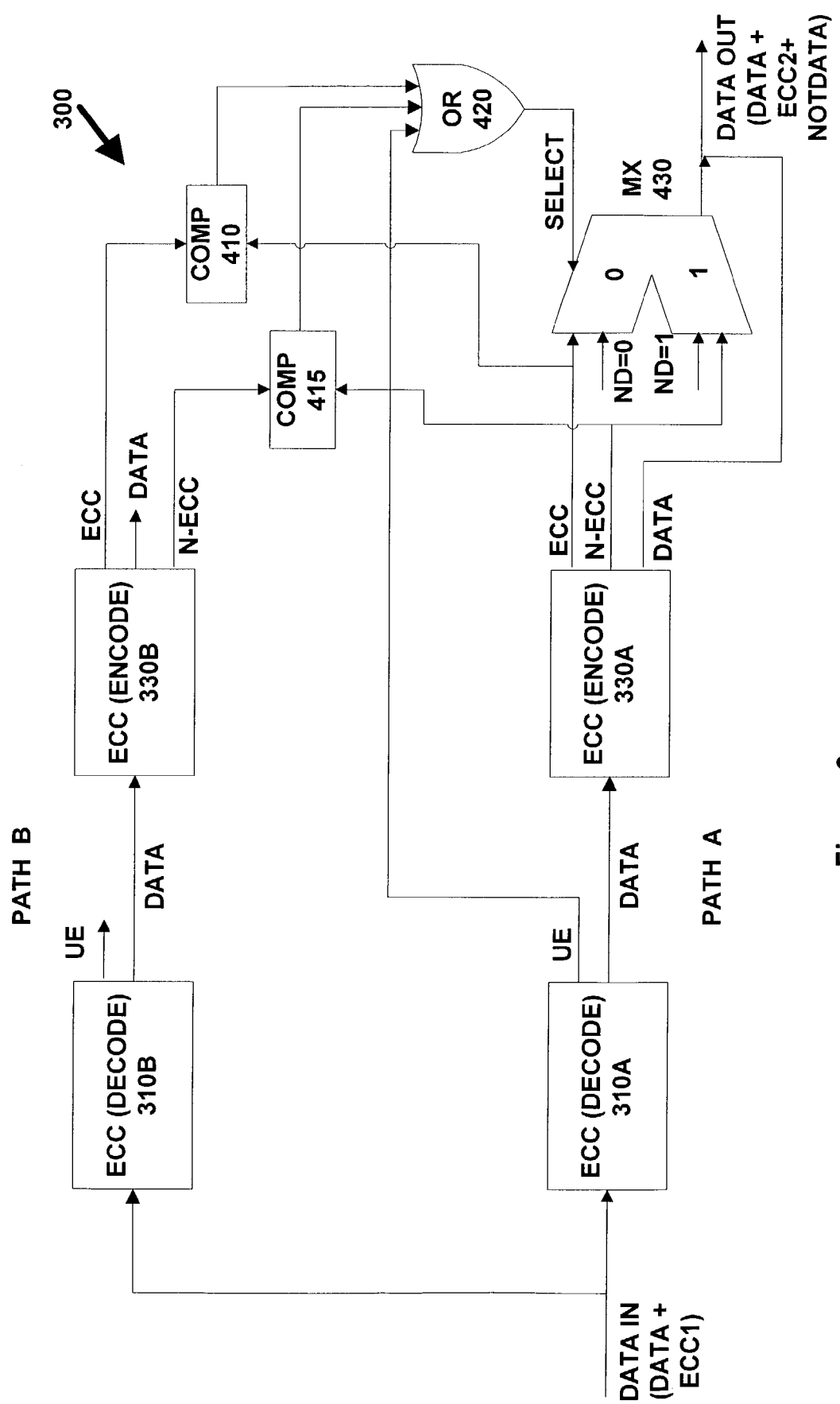
FIG. 6 is a simplified schematic block diagram of an ECC conversion facility to support cut-through routing in accordance with yet another embodiment of the invention.

Cut-through routing is supported by the embodiment of an ECC conversion facility 300 illustrated in FIG. 6. This represents a modification to the embodiment of FIG. 5 (and so only the differences in operation between the embodiments of FIGS. 5 and 6 will now be discussed). The modification arises from the fact that in cut-through routing, the outgoing packet has already started transmission before the OR gate 420 can supply a Select signal to multiplexer 430. The reason for this is that the inputs to OR gate 420, namely a UE signal from decoder 310A and a mismatch signal from comparator 410 and comparator 415 (see below), are only generated once the whole incoming packet has been received. However, by this time, transmission of the outgoing packet has already started. Consequently, in the event that an error is detected, it is too late to use any special notdata data component in the output (as is done for the embodiment of FIG. 5), given that the original data is already on its way in the outgoing packet.

A further implication of this timing difference arises from the fact that the notdata indicator must itself be covered by the ECC in the outgoing packet. It will be appreciated that in the configuration of FIG. 5, the selection between ND=0 and ND=1 (i.e. whether or not the data is valid) relies upon the calculated ECC. In the event that a mismatch is indeed detected by comparator 410, an alternative (predetermined) ECC can then be utilised instead. Unfortunately, in a system that supports cut-through routing, the outgoing data component has already been committed at this stage, and so the ECC must accommodate this data portion, irrespective of the value of the notdata indicator. Therefore, unlike in the embodiment of FIG. 5, it is not possible to use a predetermined value for the ECC portion in the event that ND=1.

This leads to a potential circularity, in that the ECC portion depends on the value of the notdata indicator, while the notdata indicator depends on the value of the ECC portion (as a result of the verification by comparator 410). The embodiment of FIG. 6 resolves this difficulty by having encoders 330A and 330B each produce two values of the outgoing ECC. The first assumes that ND=0, and so is fed to the top half of multiplexer 430 (i.e. for a select input of zero). The second (N-ECC) is calculated on the assumption that ND=1, and so is fed to the bottom half of multiplexer 430 (i.e. for a select input of one).

Note that both of the values for the ECC are determined using the incoming data signal, which can therefore be routed from encoder 330A directly to the output, bypassing the multiplexer 430. Consequently, this approach allows the data component of the outgoing packet to be transmitted before the whole of the incoming packet has been received. The timing of the embodiment of FIG. 6 is then arranged so that after this data portion has been transmitted, it is followed by the selected output from the multiplexer 430, comprising the notdata indicator and appropriate ECC portion, in order to complete the outgoing packet. (It will be appreciated that the notdata indicator and ECC portion for the outgoing packet cannot be determined until the whole incoming packet has been received, so the system must contain sufficient buffering to accommodate this).

Also shown in FIG. 6 is a second comparator 415. This is provided to confirm that the two outputs that assume ND=1 (i.e. N-ECC) properly match one another. The output from comparator 415 is forwarded to OR gate 420, where it can trigger the selection of the ND=1 output in the event of any mismatch between the N-ECC outputs of the two encoders. Note that because comparators 410 and 415 operate in parallel, there is no increase in path length (compared to the embodiment of FIG. 5).

Although the embodiments of FIGS. 3 through 6 present a range of techniques for handling errors detected within the ECC conversion facility 300, many other approaches are possible. For example, the embodiment of FIG. 5 could be altered so as not to use a notdata indicator. Rather, the second input to the multiplexer may be arranged to have a value for the data plus ECC that represents an uncorrectable error (typically because it contains too many internal inconsistencies). The exact manner of doing this will depend upon the particular ECC being used. The overall effect of providing such a value is that recipients of output data from the ECC conversion facility 300 are alerted to the fact that the received data is incorrect, and so will not rely upon it.

The ECC conversion facility 300 is typically implemented as a portion of a larger semiconductor device, such as a processor 10 (see FIG. 2), although it may comprise an entire device, for example, an application specific integrated circuit (ASIC). It is also possible for the different components within the facility 300 to be formed on two or more different devices, such as one path provided by a first device, and the other path by a second device (this may help to reduce the likelihood of an error occurring simultaneously on both paths). More generally, the conversion facility may be implemented by any appropriate digital electronics suitable for handling ECCs.

Furthermore, although the facility 300 has been described primarily in the context of computer systems, it will be appreciated that it may find applicability in any technology where ECCs are or may be employed. This potentially includes many fields of digital electronics, including (without limitation), consumer devices for digital audio and video, mobile and fixed telecommunication systems, various embedded systems within automobiles and other machines, and so on. The majority of these systems of course operate using binary, but the invention is not so limited. Rather, it applies to the conversion of ECCs in any numerical base (including the conversion, for example, between a binary ECC and a decimal ECC).

Accordingly, although a variety of particular embodiments have been described in detail herein, it will be appreciated that this is by way of exemplification only. The skilled person will be aware of many further potential modifications and adaptations that fall within the scope of the claimed invention and its equivalents.

The invention claimed is:

1. Apparatus for performing an Error Correcting Code (ECC) conversion, the apparatus comprising:
    a first interface for receiving input data protected in accordance with a first ECC;
    first and second processing paths, each connected to the first interface;
    first and second decoders incorporated into said respective first and second processing paths, each configured to extract clear data from input data protected in accordance with said first ECC;
    a first encoder incorporated into said first processing path after said first decoder, configured to protect clear data in accordance with a second ECC; and
    a second interface connected to both of said first and second processing paths, and configured to provide output data protected in accordance with said second ECC, wherein a first portion of said output data is received from the first processing path, and a second portion of said output data is received from the second processing path, and wherein the first ECC is different from the second ECC, and wherein the second ECC is systematic, and wherein the first portion is an ECC portion and the second portion is clear data.

2. The apparatus of claim 1 further comprising a second encoder incorporated into said second processing path after said second decoder, configured to protect clear data in accordance with said second ECC.

3. The apparatus of claim 2, further including at least one comparator connected to the first encoder and the second encoder in order to check that their outputs match.

4. The apparatus of claim 3, wherein said at least one comparator only checks that a part of the outputs from the first and second encoders match.

5. The apparatus of claim 4, wherein the second ECC is systematic, and said at least one comparator only checks that an ECC portion of the outputs from the first and second encoders match.

6. The apparatus of claim 3, wherein said second interface includes an error indication which is activated if the outputs do not match.

7. The apparatus of claim 6, wherein said error indication comprises a notdata flag that is incorporated into the data protected by the second ECC.

8. The apparatus of claim 1, further including a mixer, wherein said second interface is connected to the first and second processing paths via the mixer, and the mixer is configured to combine said first and second portions in order to generate said output data.

9. The apparatus of claim 1, further including an output flag, said flag being set whenever the first or second decoder detects an uncorrectable error in the input data.

10. The apparatus of claim 1, wherein said apparatus is formed on a single semiconductor device.

11. The apparatus as recited in claim 1 wherein the clear data is provided directly from the second decoder.

12. A method for performing an Error Correcting Code (ECC) conversion, the method comprising:
    receiving input data protected in accordance with a first ECC, and directing the received input data along each of first and second processing paths;
    extracting clear data from the input data at each of first and second decoders incorporated into the first and second processing paths respectively;
    determining at a first encoder incorporated into said first processing path an ECC portion for protecting the clear data with a second ECC; and
    generating output data representing said clear data protected in accordance with the second ECC, wherein a first portion of said output data is received from the first processing path, and a second portion of said output data is received from the second processing path, and wherein the second portion of said output data comprises clear data directly from the second decoder.

13. The method of claim 12, wherein the first ECC is different from the second ECC.

14. The method of claim 12, further comprising determining at a second encoder, the ECC portion, and comparing respective outputs from the first and second encoders in order to check that they match.

15. The method of claim 14, further comprising providing an error indication at the second interface if the outputs from the first and second encoders do not match.

16. The method of claim 15, wherein said error indication comprises a notdata flag that is incorporated into the data protected by the second ECC.

17. The method of claim 12, further comprising:
    detecting an uncorrectable error in the input data at said first or second decoder; and
    setting an output flag in response to the detection of the uncorrectable error.

18. The method as recited in claim 12 wherein the first portion is the ECC portion.

19. Apparatus for performing an Error Correcting Code (ECC) conversion, the apparatus comprising:
    a first interface for receiving input data protected in accordance with a first ECC;
    first and second processing paths, each connected to the first interface;
    first and second decoders incorporated into said respective first and second processing paths, each configured to extract clear data from input data protected in accordance with said first ECC;
    a first encoder incorporated into said first processing path after said first decoder, configured to protect clear data in accordance with a second ECC, and wherein the second ECC is systematic; and
    a second interface connected to both of said first and second processing paths, and configured to provide output data protected in accordance with said second ECC, wherein a first portion of said output data is received from the first processing path, and a second portion of said output data is received from the second processing path, and wherein the first portion of said output data is an ECC portion and the second portion of said output data is clear data.

20. The apparatus as recited in claim 19 wherein the clear data is provided directly from the second decoder.

21. The apparatus as recited in claim 19 further comprising a second encoder coupled to the second decoder and at least one comparator coupled to the first encoder and the second encoder in order to check that their outputs match.

22. The apparatus as recited in claim 21, wherein said second interface includes an error indication which is activated if the outputs do not match.

23. The apparatus as recited in claim 22, wherein said error indication comprises a notdata flag that is incorporated into the data protected by the second ECC.

24. The apparatus as recited in claim 19, further comprising an output flag, said flag being set whenever the first or second decoder detects an uncorrectable error in the input data.

* * * * *